(12) United States Patent
Nakahata

(10) Patent No.: US 7,713,878 B2
(45) Date of Patent: May 11, 2010

(54) METHOD OF RECOVERING AND REPRODUCING SUBSTRATES AND METHOD OF PRODUCING SEMICONDUCTOR WAFERS

(75) Inventor: Seiji Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/895,142

(22) Filed: Jul. 21, 2004

(65) Prior Publication Data

US 2005/0037595 A1 Feb. 17, 2005

(30) Foreign Application Priority Data

Aug. 11, 2003 (JP) ............... 2003-291575

(51) Int. Cl.
*H01L 21/302* (2006.01)

(52) U.S. Cl. ............... 438/689; 438/478; 257/E21.211; 257/E21.22

(58) Field of Classification Search ......... 438/455–459, 438/689, 758, 478, 494, 498, 504; 257/E21.211, 257/E21.218–E21.223
See application file for complete search history.

(56) References Cited

U.S. PATENT DOCUMENTS

| | | | | |
|---|---|---|---|---|
| 5,374,564 A | * | 12/1994 | Bruel | ............... 438/455 |
| 5,681,775 A | * | 10/1997 | Pogge | ............... 438/406 |
| 5,770,887 A | * | 6/1998 | Tadatomo et al. | ............ 257/613 |
| 5,856,229 A | * | 1/1999 | Sakaguchi et al. | ......... 438/406 |
| 6,107,213 A | * | 8/2000 | Tayanaka | ............... 438/762 |
| 6,146,979 A | * | 11/2000 | Henley et al. | ............... 438/458 |
| 6,468,923 B1 | * | 10/2002 | Yonehara et al. | ............ 438/761 |
| 6,559,075 B1 | * | 5/2003 | Kelly et al. | ............... 438/795 |
| 6,699,770 B2 | * | 3/2004 | Torvik | ............... 438/406 |
| 6,716,721 B2 | | 4/2004 | Dietrich et al. | |
| 6,720,238 B2 | | 4/2004 | Dietrich et al. | |
| 6,891,871 B1 | * | 5/2005 | Nomura et al. | .......... 372/45.01 |
| 2002/0173086 A1 | | 11/2002 | Dietrich et al. | |

(Continued)

FOREIGN PATENT DOCUMENTS

JP    09-237884    9/1997

(Continued)

OTHER PUBLICATIONS

Akasaki, Isamu, *Group III Nitride Semiconductor* Kabushiki Kaisha Baifukan 1999 pp. 93-102.

(Continued)

*Primary Examiner*—Davienne Monbleau
*Assistant Examiner*—Matthew Reames
(74) *Attorney, Agent, or Firm*—McDermott Will & Emery LLP

(57) ABSTRACT

A method of recovering a first substrate, including the steps of: sticking a second substrate on a semiconductor layer epitaxially grown on the first substrate; and separating the semiconductor layer and the first substrate. Furthermore, a method of reproducing a first substrate, including the step of surface processing the first substrate separated. Furthermore, a method of reproducing a first substrate, including the step of homoepitaxially growing the first substrate surface processed. Furthermore, a method of producing a semiconductor wafer, including the step of epitaxially growing a semiconductor layer on a first substrate. Thus a group III nitride or similar, expensive substrate can be used to efficiently and economically, epitaxially grow a group III nitride or similar semiconductor layer.

4 Claims, 1 Drawing Sheet

U.S. PATENT DOCUMENTS

| | | | |
|---|---|---|---|
| 2003/0118897 A1* | 6/2003 | Mino et al. | 429/149 |
| 2003/0145783 A1* | 8/2003 | Motoki et al. | 117/89 |
| 2004/0014297 A1* | 1/2004 | Wu et al. | 438/455 |

FOREIGN PATENT DOCUMENTS

| | | |
|---|---|---|
| JP | 10-200080 | 7/1998 |
| JP | 11-243039 | 9/1999 |
| JP | 2000-349267 | 12/2000 |

OTHER PUBLICATIONS

Shibata, Naoki, "Fabrication of LED Based on III-V Nitride and its Applications", *Journal of the Japanese Association for Crystal Growth* Japanese Association for Crystal Growth, vol. 29, No. 3 2002 pp. 283-287.

Porowski, S., et al., "Thremodynamical properties of III-V nitrides and crystal growth of GaN at high $N_2$ pressure", *Journal of Crystal Growth 178* Elsevier Science B. V., 1997 pp. 174-188.

Japanese Notice of Grounds of Rejection, w/ English translation thereof, issued in Japanese Patent Application No. JP 2003-291575 dated Nov. 17, 2009.

* cited by examiner

METHOD OF RECOVERING AND REPRODUCING SUBSTRATES AND METHOD OF PRODUCING SEMICONDUCTOR WAFERS

BACKGROUND OF THE INVENTION

1. Field of the Invention

The present invention relates generally to methods of efficiently recovering and reproducing substrates and methods of efficiently producing semiconductor wafers. More specifically, the present invention relates to methods of recovering and reproducing a first substrate having a semiconductor layer formed thereon and methods of producing semiconductor wafers including the steps of sticking a second substrate on the semiconductor layer and separating the first substrate from the semiconductor layer.

2. Description of the Background Art

To grow a group III nitride semiconductor such as $Al_xGa_yIn_{1-x-y}N$, wherein $0 \leq x$, $0 \leq y$, and $x+y \leq 1$, a sapphire substrate is currently, generally used (see *Group III Nitride Semiconductor*, edited by Isamu Akasaki, Kabushiki Kaisha Baifukan, Dec. 8, 1999, pp. 93-102, or Naoki Shibata, "Fabrication of LED Based on III-V Nitride and its Applications", *Journal of the Japanese Association for Crystal Growth*, JACG, vol. 29, No. 3, 2002, pp. 283-287). A sapphire crystal and a group III nitride crystal, however, do not match in lattice constant, and to use a sapphire substrate to epitaxially grow a group III nitride semiconductor layer it is necessary to initially deposit a group III amorphous layer on the sapphire substrate as a low-temperature deposited buffer layer and subsequently deposit the group III nitride semiconductor layer on the buffer layer, which results in reduced production efficiency.

If the above substrate is a group III nitride substrate, then the group III nitride semiconductor layer can epitaxially grown directly on the group III nitride substrate. (See S. Porowski et al., "Thermodynamical properties of III-V nitrides and crystal growth of GaN at high $N_2$ pressure", *Journal of Crystal Growth* 178, Elsevier Science B. V., 1997, pp. 174-188). The group III nitride substrate, however, is difficult to grow in liquid phase, and accordingly need to be grown in vapor phase. This cannot provide a large bulk crystal and is significantly costly.

SUMMARY OF THE INVENTION

The present invention contemplates a method of recovering and reproducing substrates and a method of producing semiconductor wafers that allow a group III nitride or similar, expensive substrate to be used to efficiently and economically, epitaxially grow a group III nitride or similar semiconductor layer.

The present invention in one aspect provides a method of recovering a first substrate, including the steps of: sticking a second substrate on a semiconductor layer epitaxially grown on the first substrate and; and separating the semiconductor layer and the first substrate.

The present invention in another aspect provides a method of reproducing a first substrate, including the steps of: sticking a second substrate on a semiconductor layer epitaxially grown on the first substrate; separating the semiconductor layer and the first substrate; and surface-processing the first substrate separated. In addition to the above steps the present method of reproducing the first substrate can include the step of homoepitaxially growing the first substrate surface-processed.

The present invention in still another aspect provides a method of producing a semiconductor wafer, including the steps of: sticking a second substrate on a semiconductor layer epitaxially grown on a first substrate; and separating the semiconductor layer and the first substrate. In addition to the above steps the present method of producing the semiconductor wafer can include the steps of:

surface-processing the first substrate separated; and epitaxially growing a semiconductor layer on the first substrate surface-processed. Furthermore in addition to the above step the method can include the steps of: surface-processing the first substrate separated; homoepitaxially growing the first substrate surface-processed; and epitaxially growing a semiconductor layer on the first substrate homoepitaxially grown.

Thus in accordance with the present invention the first substrate that is expensive and poor in productivity can efficiently be recovered and reproduced and a semiconductor wafer can efficiently and economically be produced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention in an embodiment will be described with reference to the drawings specifically.

Figure 1:
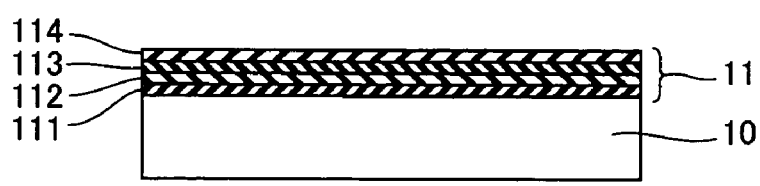
FIG. 1 shows in accordance with the present invention the step of epitaxially grow a semiconductor layer on a first substrate.
Figure 2:
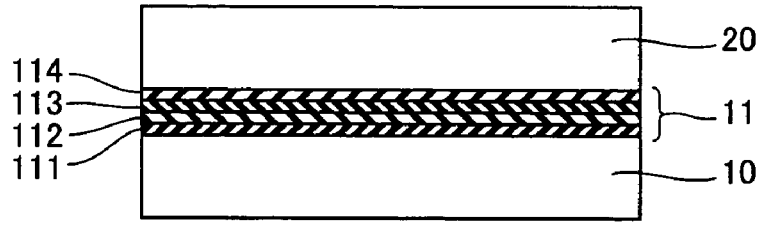
FIG. 2 shows in accordance with the present invention the step of sticking a second substrate on the semiconductor layer epitaxially grown on the first substrate.

In accordance with the present invention a first substrate is recovered by a method in an embodiment, as follows. With reference to FIGS. 1 and 2, a first substrate 10 underlies an epitaxially grown semiconductor layer 11 and a second substrate 20 is stuck thereon. Then, with reference to FIG. 3, semiconductor substrate 11 and the first substrate 10 are separated. Thus the first substrate can efficiently be recovered.

Herein, the first substrate 10 in the present invention refers to an expensive substrate to be recovered, for example including a group III nitride substrate formed of a group III nitride such as $Al_xGa_yIn_{1-x-y}N$, wherein $0 \leq x$, $0 \leq y$, and $x+y \leq 1$. The first substrate is not particularly limited in thickness. When handleability is considered, however, the first substrate preferably has a thickness of no less than 1.5 mm.

Semiconductor layer 11 epitaxially grown on the first substrate 10 is not limited to a particular semiconductor layer 11. If the first substrate 10 is a group III nitride substrate, however, then semiconductor substrate 11 is implemented by a group III nitride semiconductor formed of a group III nitride such as $Al_xGa_yIn_{1-x-y}N$ and epitaxially grown, wherein $0 \leq x$, $0 \leq y$, and $x+y \leq 1$. Furthermore, semiconductor layer 11 is not limited to a single semiconductor layer and may be more than one semiconductor layer deposited in layers.

How semiconductor layer 11 should epitaxially be grown is not particularly limited. If the group III nitride semiconductor layer is epitaxially grown, it is preferably grown by metal organic chemical vapor deposition (MOCVD), molecular beam epitaxy (MBE), hydride vapor phase epitaxy (HVPE) or the like.

The second substrate 20 refers to a substrate stuck on semiconductor layer 11 and may be any general-purpose substrate suitable for sticking on semiconductor layer 11. The second substrate 20 preferably includes a Si substrate, an Al substrate, a Cu substrate, a Cu—W substrate, and the like. The second substrate is not particularly limited in thickness. When handleability is considered, however, the second substrate preferably has a thickness of no less than 300 μm.

How the second substrate 20 is stuck on semiconductor layer 11 is not particularly limited. Preferably, the second substrate 20 is brazed. More specifically, Ag, Ni, Au, Ge, Ti, an alloy thereof, or a similar wax is for example sputtered or vapor-deposited on semiconductor layer 11 and then melted and the second substrate 20 is placed thereon and thus stuck together. Alternatively, a paste containing Ag, Ni, Au, Ge, Ti or an alloy thereof is applied on semiconductor layer 11 and the second substrate 20 is placed thereon and thus stuck together.

How semiconductor layer 11 and the first substrate 10 should be separated is not particularly limited. Preferably, they are separated for example by using a wire saw or an inner, radial blade to mechanically slice the same, or electrolytically etching or similarly, chemically treating the same. In the electrolytical etching, for example the first substrate and the semiconductor layer with a conductive layer previously introduced therebetween are immersed in an electrolyte and a current is passed through the conductive layer to etch the conductive layer to separate the first substrate and the semiconductor layer. For example if the first substrate is a group III nitride substrate and the semiconductor layer is a group III nitride semiconductor layer, the conductive layer is formed of a group III nitride layer heavily doped for example with Si (and providing a specific resistance of approximately $10^{-2} \Omega \cdot cm$), and approximately 1N of aqueous KOH solution is used with Pt corresponding to a negative electrode and the conductive layer serving as a positive electrode and a current of approximately 1 mA is passed to etch the conductive layer.

Figure 3:
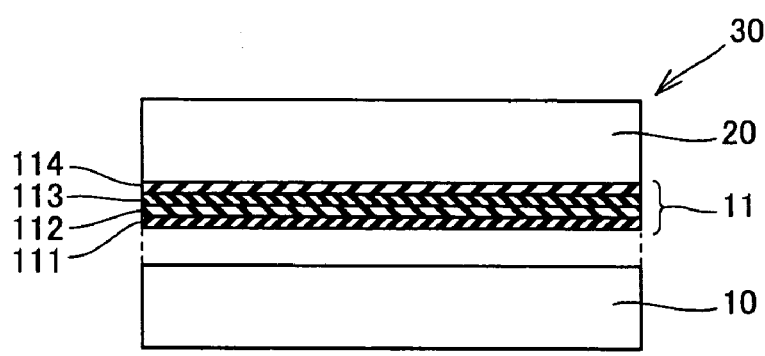
FIG. 3 shows in accordance with the present invention the step of separating the semiconductor layer and the first substrate.

Desirably, semiconductor layer 11 and the first substrate 10 are separated ideally at an interface of semiconductor layer 11 and the first substrate 10, as shown in FIG. 3. In that case ideally the intermediate product is separated into the second substrate 20 and semiconductor layer 11 together forming a semiconductor wafer 30, and the first substrate 10. In reality, however, a portion of the first substrate can remain on semiconductor wafer 30 at a surface of semiconductor layer 11 (not shown) or a portion of the semiconductor layer can remain on a surface of the first substrate 10 (not shown). Furthermore, if they are mechanically sliced and thus separated, it is difficult to slice them at their interface, and if they are successfully sliced at the interface, semiconductor layer 11 is often damaged and has a surface with protrusions and depressions, defects in crystallinity, and the like. Accordingly, in reality, to minimize damage to semiconductor layer 11, a portion closer to the first substrate 10 than the interface of semiconductor layer 11 and the first substrate 10 is often mechanically sliced. In that case, the intermediate product is separated into the second substrate 20, semiconductor layer 11 and a portion of the first substrate 10 together forming a semiconductor wafer (not shown), and the remaining, first substrate 10. In the present invention, semiconductor wafer 30 and the first substrate 10 obtained by separating semiconductor layer 11 and the first substrate 10 include any case of the above.

In accordance with the present invention the first substrate is reproduced by a method in one embodiment, as follows: With reference to FIGS. 1 and 2, a first substrate 10 underlies an epitaxially grown semiconductor layer 11 and a second substrate 20 is stuck thereon. Then, with reference to FIG. 3, semiconductor substrate 11 and the first substrate 10 are separated. Then, with reference to FIG. 4, the first substrate 10 separated is surface processed 40. Thus the first substrate can efficiently be reproduced.

The FIGS. 1-3 steps are as has been described above. Semiconductor layer 11 and the first substrate 10 are separated and if the first substrate 10 has a surface with protrusions and depressions or defective in crystallinity (not shown) or has a surface with the semiconductor layer partially remaining thereon (not shown), then, with reference to FIG. 4, the first substrate 10 can be surface processed 40. How the first substrate 10 should be surface processed is not particularly limited. A polishing paper may be used to mechanically polish the substrate. Alternatively, polishing slurry and a polishing pad may be used to chemically, mechanically polish the substrate. Alternatively, liquid-phase etching, vapor-phase etching, or other similar chemical techniques may be employed. If the first substrate is a group III nitride substrate and undergoes liquid-phase etching, the substrate is for example brought into contact with etchant of a liquid at least containing Na, Li or Ca.

In accordance with the present invention the first substrate is reproduced by the method in another embodiment, as follows: With reference to FIGS. 1 and 2, the first substrate 10 underlies an epitaxially grown semiconductor substrate 11 and the second substrate 20 is stuck thereon. Then, with reference to FIG. 3, semiconductor layer 11 and the first substrate 10 are separated. Then, with reference to FIG. 4, the first substrate 10 separated is surface-processed 40. Then, with reference to FIG. 5, the first substrate 10 surface processed is homoepitaxially grown. In FIG. 5, the first substrate 10a surface processed and thus reduced in thickness that is homoepitaxially grown provides a homoepitaxially grown portion 10b to provide the first substrate 10 reproduced with its original thickness. Thus a first substrate maintained in mechanical strength and excellent in handleability can efficiently be reproduced.

The first substrate is homoepitaxially grown when the first substrate is reduced in thickness and hence mechanical strength and handleability. For example, if the first substrate is a group III nitride substrate, then preferably it is homoepitaxially grown when it attains a thickness of no more than 0.6 mm. The homoepitaxial growth can be stopped when the first substrate recovers its original thickness or more.

How the first substrate 10 should homoepitaxially be grown is not particularly limited. If the first substrate 10 is a group III nitride substrate, HVPE, MOCVD, MBE or the like is preferably employed.

In accordance with the present invention a semiconductor wafer is produced by a method in an embodiment, as follows: With reference to FIGS. 1 and 2, the first substrate 10 underlies epitaxially grown semiconductor layer 11 and the second substrate 20 is stuck thereon. Then, with reference to FIG. 3, semiconductor layer 11 and the first substrate 10 are separated. Thus semiconductor wafer 30 can efficiently be produced. Furthermore, by changing the second substrate 20 to be stuck, semiconductor wafer 30 having stuck thereto a substrate accommodating the application of interest, can efficiently be produced.

Note that the first substrate 10 and semiconductor substrate 11 are separated and if semiconductor wafer 30 obtained has semiconductor layer 11 having a surface with a portion of the first substrate remaining thereon (not shown) or semiconductor layer 11 having a surface with protrusions or depressions, defective in crystallinity, and/or the like (not shown), then a surface processing similar to surface processing 40 applied to the first substrate 10 as described above can be performed. This processing is not limited to any particular method. A polishing paper may be used to mechanically polish the substrate. Alternatively, polishing slurry and a polishing pad may be used to chemically, mechanically polish the substrate. Alternatively, liquid-phase etching, vapor-phase etching, or other similar chemical techniques may be employed. If the first substrate is a group III nitride substrate and undergoes liquid-phase etching, the substrate is for example brought into contact with etchant of a liquid at least containing Na, Li or Ca.

In accordance with the present invention a semiconductor wafer is produced by the method in another embodiment, as follows: With reference to FIGS. 1 and 2, the first substrate 10 underlies an epitaxially grown semiconductor substrate 11 and the second substrate 20 is stuck thereon. Then, with reference to FIG. 3, semiconductor layer 11 and the first substrate 10 are separated. Then, with reference to FIG. 4, the first substrate 10 separated is surface-processed 40. Then, with reference again to FIG. 1, a semiconductor layer 11 is epitaxially grown on the first substrate 10 surface processed. Thus the FIGS. 1-4 steps are performed and the FIG. 1 step is then again formed. The steps cyclically performed as described above allow semiconductor wafer 30 to be produced further efficiently.

In accordance with the present invention a semiconductor wafer is produced by the method in still another embodiment, as follows: With reference to FIGS. 1 and 2, the first substrate 10 underlies an epitaxially grown semiconductor substrate 11 and the second substrate 20 is stuck thereon. Then, with reference to FIG. 3, semiconductor layer 11 and the first substrate 10 are separated. Then, with reference to FIG. 4, the first substrate 10 separated is surface-processed 40. Then, with reference to FIG. 5, the first substrate 10 surface processed is homoepitaxially grown. Then, with reference again to FIG. 1, a semiconductor layer 11 is epitaxially grown on the first substrate 10 homoepitaxially grown. Thus the FIGS. 1-5 steps are performed and the FIG. 1 step is then again formed. The steps cyclically performed as described above allow semiconductor wafer 30 to be produced further efficiently.

The present invention will more specifically be described with reference to examples.

First Example

With reference to FIG. 1, the first substrate 10 implemented by a group III nitride, GaN substrate having a thickness of 1.5 mm is used and MOCVD is employed to deposit semiconductor layer 11 on the GaN substrate heated to 1000° C. Semiconductor layer 11 is implemented by group III nitride semiconductor layer formed of a p-GaN layer 111 having a thickness of 150 nm, a p-$Al_{0.2}Ga_{0.8}N$ layer 112 having a thickness of 60 nm, an $In_{0.2}Ga_{0.8}N$ layer 113 having a thickness of 3 nm, and an n-GaN layer 114 having a thickness of 5000 nm deposited successively.

Then, with reference to FIG. 2, on the semiconductor layer 111 outermost, surface layer or n-GaN layer 114, Ag serving as a wax member is sputtered and thus deposited and then melted and the second substrate 20 implemented by a Si substrate having a thickness of 30 μm is stuck thereon. Then, with reference to FIG. 3, a wire saw is used to separate semiconductor layer 111 and the first substrate 10. More specifically, although not shown, a portion of the first substrate that is 80 μm distant from the interface of the semiconductor layer and the first substrate is sliced with the wire saw parallel to the interface.

Figure 4:
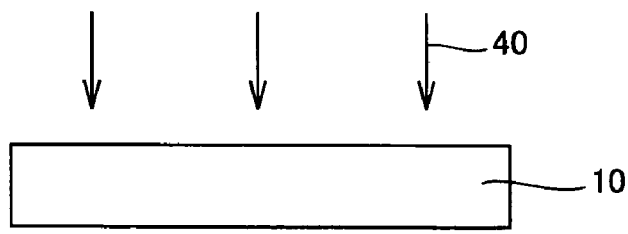
FIG. 4 shows in accordance with the present invention the step of surface-processing the first substrate separated.
Figure 5:
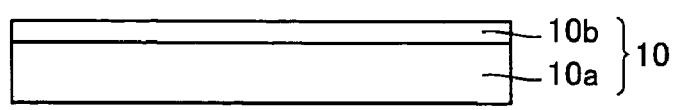
FIG. 5 shows in accordance with the present invention the step of epitaxially growing the first substrate having surface-processed.

Then, with reference to FIG. 4, the first substrate 10 separated is surface-processed 40. More specifically, a liquid of Na serving as etchant is placed on the first substrate 10 or GaN substrate and a surface plate having a flat surface is pressed against the GaN substrate while it is rotated at 50 rpm for one hour to perform liquid-phase etching. Then, with reference to FIG. 5, the first substrate 10 or GaN substrate surface-processed to have a thickness of no more than 0.6 mm is heated to 1000° C., and HVPE is employed and GaN, the same material as the GaN substrate, is used to homoepitaxially grow the substrate. When the GaN substrate recovers its original thickness, i.e., 1.5 mm, the homoepitaxial growth is terminated. Note that the substrate or the semiconductor layer is controlled in thickness by the time required to grow the substrate or the semiconductor layer. More specifically, an experiment is previously conducted to obtain a relationship between the time required to grow the substrate or the semiconductor layer and its thickness and for example a time required for growth is determined to allow the GaN substrate to have a thickness of 1.5 mm. The GaN substrate's thickness before the experiment and the growth can be measured with a film thickness meter of contact type. The result is shown in Table 1.

TABLE 1

|  |  | 1st Example | 2nd Example | 3rd Example | 4th Example |
| --- | --- | --- | --- | --- | --- |
| 1st substrate | Material | GaN | AlN | InN | $Al_{0.5}Ga_{0.5}N$ |
| Epitaxially growing the semiconductor layer | Method of formation | MOCVD | MOCVD | MOCVD | MOCVD |
|  | Chemical Composition (layer thickness: nm) | p-GaN(150)/ p-$Al_{0.2}Ga_{0.8}N$(60)/ $In_{0.2}Ga_{0.8}N$(3)/ n-GaN(5000) | p-GaN(150)/ p-$Al_{0.2}Ga_{0.8}N$(60)/ $In_{0.2}Ga_{0.8}N$(3)/ n-GaN(5000) | p-GaN(150)/ p-$Al_{0.2}Ga_{0.8}N$(60)/ $In_{0.2}Ga_{0.8}N$(3)/ n-GaN(5000) | p-GaN(150)/ p-$Al_{0.2}Ga_{0.8}N$(60)/ $In_{0.2}Ga_{0.8}N$(3)/ n-GaN(5000) |
| 2nd substrate | Material | Si | Cu | Cu—W | Al |
| Sticking the semiconductor substrate on the 2nd substrate | Method | Brazed | Brazed | Brazed | Brazed |
|  | Material (mole %) | Ag | Ni | Ti | Au(50) Ge(50) |

TABLE 1-continued

|  |  | 1st Example | 2nd Example | 3rd Example | 4th Example |
|---|---|---|---|---|---|
| Separating the semiconductor layer and the 1st substrate | Tool | Wire saw | Wire saw | Inner, radial blade | Inner, radial blade |
| Surface processing the 1st substrate separated | Method | Liquid-phase etching | Liquid-phase etching | Liquid-phase etching | Liquid-phase etching |
|  | Etchant | Na | Na | Na | Na |
| Homoepitaxially growing the 1st substrate surface processed | Method | HVPE | HVPE | HVPE | HVPE |
|  | Material | GaN | AlN | InN | $Al_{0.5}Ga_{0.5}N$ |

Second Example

Except that the first and second substrates are AlN and Cu substrates, respectively, the wax material is Ni, and the AlN substrate is homoepitaxially grown with AlN used as material, the first substrate has a semiconductor layer deposited thereon, the semiconductor layer has the second substrate stuck thereon, the semiconductor layer and the first substrate are separated, the first substrate separated is surface processed and then homoepitaxially grown, similarly as has been described in the first embodiment. The result is also shown in Table 1.

Third Embodiment

Except that the first and second substrates are InN and Cu—W substrates, respectively, the wax material is Ti, The semiconductor layer and the first substrate are separated with an inner, radial blade and the InN substrate is homoepitaxially grown with InN used as material, the first substrate has a semiconductor layer deposited thereon, the semiconductor layer has the second substrate stuck thereon, the semiconductor layer and the first substrate are separated, the first substrate separated is surface processed and then homoepitaxially grown, similarly as has been described in the first embodiment. The result is also shown in Table 1.

Fourth Example

Except that the first and second substrates are $Al_{0.5}Ga_{0.5}N$ and Al substrates, respectively, the wax member is Au (50 mole %)-Ge (50 mole %), the semiconductor layer and the first substrate are separated with an inner, radial blade, and the $Al_{0.5}Ga_{0.5}N$ substrate is homoepitaxially grown with $Al_{0.5}Ga_{0.5}N$ used as material, the first substrate has a semiconductor layer deposited thereon, the semiconductor layer has the second substrate stuck thereon, the semiconductor layer and the first substrate are separated, the first substrate separated is surface processed and then homoepitaxially grown, similarly as has been described in the first embodiment. The result is also shown in Table 1.

The present invention can recover and reproduce a group III nitride or similar, expensive substrate to form a cyclical semiconductor wafer production process to efficiently and economically produce a semiconductor wafer having a group III nitride semiconductor layer or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of reproducing a first substrate formed of a group III nitride, comprising the steps of:

epitaxially growing a first semiconductor layer on said first substrate;

sticking a second substrate on said first semiconductor layer epitaxially grown on said first substrate;

separating said first semiconductor layer and said first substrate by mechanical slicing such that a portion of said first substrate remains at a surface of said first semiconductor layer; and surface-processing said first substrate separated from said first semiconductor layer after the step of separating; wherein the step of surface-processing is performed by liquid-phase etching in which said first substrate is brought into contact with etchant of a liquid at least containing a liquid of Na.

2. A method of reproducing a first substrate formed of a group III nitride, comprising the steps of:

epitaxially growing a first semiconductor layer on said first substrate;

sticking a second substrate on said first semiconductor layer epitaxially grown on said first substrate;

separating said first semiconductor layer and said first substrate by mechanical slicing such that a portion of said first substrate remains at a surface of said first semiconductor layer;

surface-processing said first substrate separated from said first semiconductor layer after the step of separating; and homoepitaxially growing a second semiconductor layer on said first substrate separated from said first semiconductor layer after the step of surface-processing; wherein the step of surface-processing is performed by liquid-phase etching in which said first substrate is brought into contact with etchant of a liquid at least containing a liquid of Na.

3. A method of producing a semiconductor wafer, comprising the steps of:

epitaxially growing a first semiconductor layer on said first substrate;

sticking a second substrate on said first semiconductor layer epitaxially grown on a first substrate formed of a group III nitride;

separating said first semiconductor layer and said first substrate by mechanical slicing such that a portion of said first substrate remains at a surface of said first semiconductor layer;

surface-processing said first substrate separated from said first semiconductor layer after the step of separating; and epitaxially growing a third semiconductor layer on said first substrate separated from said first semiconductor layer after the step of surface-processing; wherein the step of surface-processing is performed by liquid-phase etching in which said first substrate is brought into contact with etchant of a liquid at least containing a liquid of Na.

4. A method of producing a semiconductor wafer, comprising the steps of:

epitaxially growing a first semiconductor layer on said first substrate;

sticking a second substrate on said first semiconductor layer epitaxially grown on a first substrate formed of a group III nitride;

separating said first semiconductor layer and said first substrate by mechanical slicing such that a portion of said first substrate remains at a surface of said first semiconductor layer;

surface-processing said first substrate separated from said first semiconductor layer after the step of separating;

homoepitaxially growing a second semiconductor layer on said first substrate separated from said first semiconductor layer after the step of surface-processing; and epitaxially growing a fourth semiconductor layer on said first substrate separated from said first semiconductor layer after the step of homoepitaxially growing; wherein the step of surface-processing is performed by liquid-phase etching in which said first substrate is brought into contact with etchant of a liquid at least containing a liquid of Na.

* * * * *